US005589890A

United States Patent [19]
Mancuso et al.

[11] Patent Number: 5,589,890
[45] Date of Patent: Dec. 31, 1996

[54] FILTER ARCHITECTURE, PARTICULARLY FOR VIDEO APPLICATIONS

[75] Inventors: Massimo Mancuso, Favara; Rinaldo Poluzzi, Milan; Gianguido Rizzotto, Civate, all of Italy

[73] Assignees: SGS-Thomson Microelectronics S.r.l., Agrate Brianza; Consorzio per la Ricerca sulla Microelettronica nel Mezzogiorno, Catania, both of Italy

[21] Appl. No.: 314,862

[22] Filed: Sep. 29, 1994

[30] Foreign Application Priority Data

Sep. 30, 1993 [EP] European Pat. Off. .............. 93830402

[51] Int. Cl.$^6$ .................................................. H04H 5/52
[52] U.S. Cl. .......................... 348/678; 382/274; 382/261
[58] Field of Search .................................... 348/673, 678, 348/671, 674, 675, 676, 679, 686, 687, 688, 712, 711, 690, 606, 625–629, 631, 630; 382/274, 260–264; 364/724.19; H04N 5/14, 5/16, 5/20, 5/52, 5/205, 5/208, 5/57

[56] References Cited

U.S. PATENT DOCUMENTS

| | | | |
|---|---|---|---|
| 3,752,905 | 8/1973 | Schneider | 348/676 |
| 4,587,561 | 5/1986 | Kudo | 348/606 |
| 4,654,710 | 3/1987 | Richard | 348/674 |
| 4,667,304 | 5/1987 | Hier et al. | 348/678 |
| 5,162,902 | 11/1992 | Bell et al. | 348/678 |

FOREIGN PATENT DOCUMENTS 0411318  2/1991  European Pat. Off. ....... H04N 5/238

OTHER PUBLICATIONS

Kaufman et al., Hardware Realization of 2-D IIR Semisystatic Filter With Application to Real-Time Homomarphic Filtering, Feb. 1993, pp. 2-14.
Peli et al., Adaptive Filtering for Image Enhancement, Jan. 1982 vol. 21, No. 1, pp. 108–112.
Patent Abstracts of Japan, vol. 17, No. 219 (E–1358) Apr. 30, 1993 & JP-A-04354268 (Matsushita).

*Primary Examiner*—Michael H. Lee
*Attorney, Agent, or Firm*—David M. Driscoll; James H. Morris

[57] ABSTRACT

A filter architecture particularly for video applications, includes a filter section for separating high pass and low pass components from a video input signal conveying a video image, a brilliance estimating section for determining a mean brilliance value for each of a plurality of sections into which the video image is divided, first and second image characteristic adjusting sections for modifying the high pass and low pass components in response to the mean brilliance values, and a summing section for combining the modified high pass and low pass components to generate a filtered video signal. The first and second image characteristic adjusting sections operate using Fuzzy Logic which enables the filter architecture to effectively adjust contrast and brightness in the video image over a wide range of image brightness values.

41 Claims, 8 Drawing Sheets

FILTER ARCHITECTURE, PARTICULARLY FOR VIDEO APPLICATIONS

BACKGROUND OF THE INVENTION

1. Field of the Invention

This invention relates to devices for use in video applications, and particularly, to video signal filters.

2. Discussion of the Related Art

In video applications, it is often desirable to change the contrast and luminance associated with an imaged picture because, due to increased variations in the brilliance of the picture relative to the sensitivity of the means provided for acquiring or storing it, details in highly brilliant or very dark areas of the picture may fail to be adequately brought out.

It should not be overlooked that contrast is related to the details of an image, while luminance contains brilliance information associated with the image itself.

To modify the contrast and luminance associated with an image, and accordingly to solve this problem, two main approaches can be followed which are both known from literature.

In the first approach, the image is defined as the product of an illumination component $i(y,x)$ from the light impinging on a picture being imaged and a reflectance component $r(y,x)$ from the light being reflected by objects within said picture. Namely:

$$f(y,x)=i(y,x)\ r(y,x)$$

where, $f(y,x)$ is the image to be processed, identified as a function of two variables, y and x, that represent the spatial co-ordinates of each of the picture elements or pixels that make up the image.

In the above definition of an image, the illumination component $i(y,x)$ is responsible for most of the change in brilliance, while the reflectance component contains detail information.

The illumination component $i(y,x)$, being tied to the image brilliance, represents the luminance in the above definition of an image, while the reflectance component, being tied to the image details, represents the contrast. Thus, the luminance and contrast associated with an image can be modified by acting on the components $i(y,x)$ and $r(y,x)$.

The aim is to reduce the illumination component $i(y,x)$ and amplify the reflectance component $r(y,x)$. To accomplish this aim, linear filters are employed which are usually of the high-pass type and operate in the density domain.

It should be considered that illumination $i(y,x)$ varies slowly in space, and therefore, contains mostly low spatial frequencies present in an image, whereas reflectance, being a process of the high-pass type, mostly contains high spatial frequencies.

In order to work with linear filters of the high-pass type, a logarithmic transform of the illumination and reflectance components is used so that the filtering operation can be made linear, that is, $$f'(y,x)=\log[f(y,x)]=i'(y,x)+r'(y,x),$$

where $i'(y,x)=\log[i(y,x)]$ and $r'(y,x)=\log[r(y,x)]$. The kind of filtering to which the illumination and reflectance components are subjected is called homomorphic.

The homomorphic filtering concept as applied to bi-dimensional images, and embodiments of linear filters of the high-pass type, are described by H. J. Kaufmann and M. A. Sid-Ahmed in the article, "Hardware Realization of a 2-D IIR Semisystolic Filter with Application to Real-Time Homomorphic Filtering", IEEE Transactions on Circuits and Systems for Video Technology, Vol. 3, No. 1, February 1993.

After filtering, to obtain the processed image, the reverse from the logarithmic transform should be carried out.

A disadvantage of using homomorphic filtering comes from the difficulty in setting a filter mask used to modify the contrast and luminance of an image. That setting is made specially difficult because the frequency characteristics of an image to be processed are not known "a priori". Known from the pertinent literature are ways of setting said mask which are based on:

a) a trial-and-error procedure for the frequency response of a filter;

b) a statistical model for the illumination and reflectance processes and attendant construction of a Wiener filter.

The second approach followed to modify the luminance and contrast associated with an image is based on the consideration that contrast may be obtained as the difference between the image itself and the mean value of the illumination component.

The mean value that the illumination component exhibits locally in an image is tied to the variation in the brilliance of said image, and, hence, to the luminance thereof.

Thus, by acting on the mean value of the illumination component, the luminance associated with an image can be modified.

An image to be treated is processed through a two-channel filter wherein one channel is reserved for processing the mean value of the illumination component, which represents the low spatial frequency component of said image, and the other channel is reserved for processing the contrast, which represents the high spatial frequency component.

Specifically, the two-channel filter acts, through non-linear characteristics, on grey levels of pixels associated with the image being processed which represent the low and high spatial frequency components.

The low spatial frequency component of the image being processed is obtained by determining the mean of grey values of pixels present in a bi-dimensional window of appropriate size, whereas the high spatial frequency component is obtained as the difference between the image itself and the low frequency component.

The low frequency component is then altered through a non-linearity which is dependent on the brilliance characteristics of the image.

To modify the high frequency component, that is the contrast signal, and accordingly to regain dim details of the image, a second non-linearity is used where a contrast amplification factor is determined according to the brilliance characteristics of the image being processed. It is mandatory that both non-linearities act to make the contrast enhancement high where the reduction in brilliance variation is large.

In fact, where the image is prevailingly a brilliant one, that is, if a possible saturation toward the white occurs, the reduction in brilliance should be applied by compressing the levels of grey approaching the white, and for given levels, by applying a high contrast amplification to bring to full view details of the image which were only dimly visible.

The reverse holds where the image to be processed is a dark one.

A two-channel filter operated in the manner described above is disclosed, for example, by Tamar Peli and Jae S. Lim in the article, "Adaptative Filtering for Image Enhancement", Optical Engineering, Vol. 21, pages 108–112 (January/February, 1982).

However, the applicability of the above-described two-channel filter to image processing is limited.

In fact, the patterns of the curves which provide the non-linearities for the filter, once they are set for one class of images, e.g. very dark images, cannot effectively be used to process very bright images because no improvement would be obtained on them.

SUMMARY OF THE INVENTION

An object of this invention is to provide a filter architecture which, through the use of a logic known in the pertinent literature as Fuzzy Logic, can be made adaptive, i.e., able to process images affected by conflicting problems (e.g. very bright or very dark images), and can be easily implemented.

This and other objects are achieved in one illustrative embodiment of the invention, in which a digital signal filter is provided for video images, including a filter circuit having a first input coupled to an input of the digital signal filter and a second input coupled to a first output of a timing circuit. The filter circuit is suitable for separating from input signals high frequency components and low frequency components. The timing circuit is suitable for generating synchronism command signals.

The digital signal filter includes a brilliance estimation circuit for at least one image section, having a first input coupled to the input of the digital signal filter, and at least second, third and fourth inputs respectively coupled to at least first, second and third outputs of the timing circuit, the brilliance estimation circuit bieng suitable for measuring and storing brightness values associated with image sections.

The digital signal filter further includes a first image characteristic adjusting circuit, operated using Fuzzy logic, and having a first input coupled to the input of the digital signal filter, a second input coupled to a first output of the first filtering circuit, and a third input coupled to an output of the brilliance estimation circuit. The first image characteristic adjusting circuit includes a device able to perform a fuzzy computation. This device may be a "Fuzzy Machine", an arithmetic unit able to perform a fuzzy inference process, a memory device (i.e. look-up table) storing results of a fuzzy computation performed off-line. In particular, in this device are stored predefined amplification values of the high frequency components of input signals to the digital signal filter.

The filter further includes a second image characteristic adjusting circuit for at least a second image characteristic, operated using Fuzzy logic, and having a first input coupled to a second output of the first filtering circuit and a second input coupled to at least one output of the brilliance estimation circuit. The second image characteristic adjusting circuit includes a second device able to perform a fuzzy computation. This device may be a "Fuzzy Machine", an arithmetic unit able to perform a fuzzy inference process, a memory device (i.e. look-up table) storing results of a fuzzy computation performed off-line. In particular, in this device are stored predefined values associated with values of the low frequency components of input signals.

BRIEF DESCRIPTION OF THE DRAWINGS

The features and advantages of the filter architecture of this invention will become apparent from the following non-limiting description of the preferred embodiment given by way of example with reference to the accompanying drawings, in which:

FIG. 8 is a diagrammatic detail view illustrating the device of FIG. 7; and

DETAILED DESCRIPTION

The filter architecture 1 which forms the subject matter of the present invention acts on individual image pixels. Specifically, this architecture processes the luminance component which is associated with an image, that is, the grey hue portion of the image. The digitized luminance component associated with an image to be processed forms the input Y to the filter architecture 1.

Figure 1:
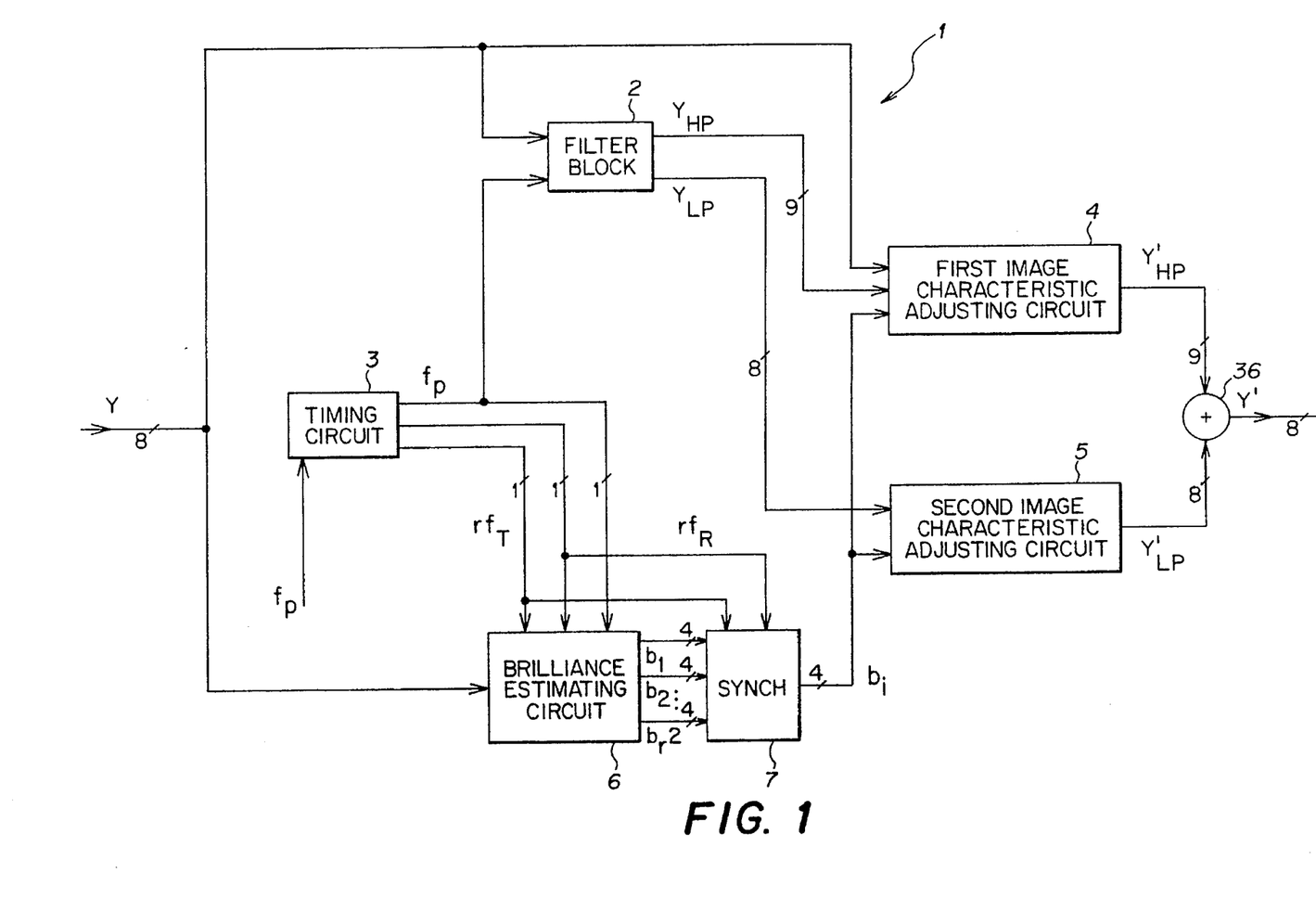
FIG. 1 is a diagrammatic view of a filter architecture embodying this invention.

With reference to the diagram shown in FIG. 1, the filter architecture 1 comprises a timing block 3 having an input terminal arranged to receive, for each luminance component Y associated with an image to be processed, a frequency reference signal fp for pixel synchronization.

The timing block 3 outputs the aforesaid signal fp, a signal rfr obtained from a signal fp of an image line scan rate multiplied r times, and a signal rft, also obtained from the signal fp of an image scan rate multiplied r times. The signal fp allows the filter architecture 1 to determine the time at which each image pixel is being processed, and the signals rfr and rft allow the filter architecture 1 to split the image being processed into sections.

Figure 2:
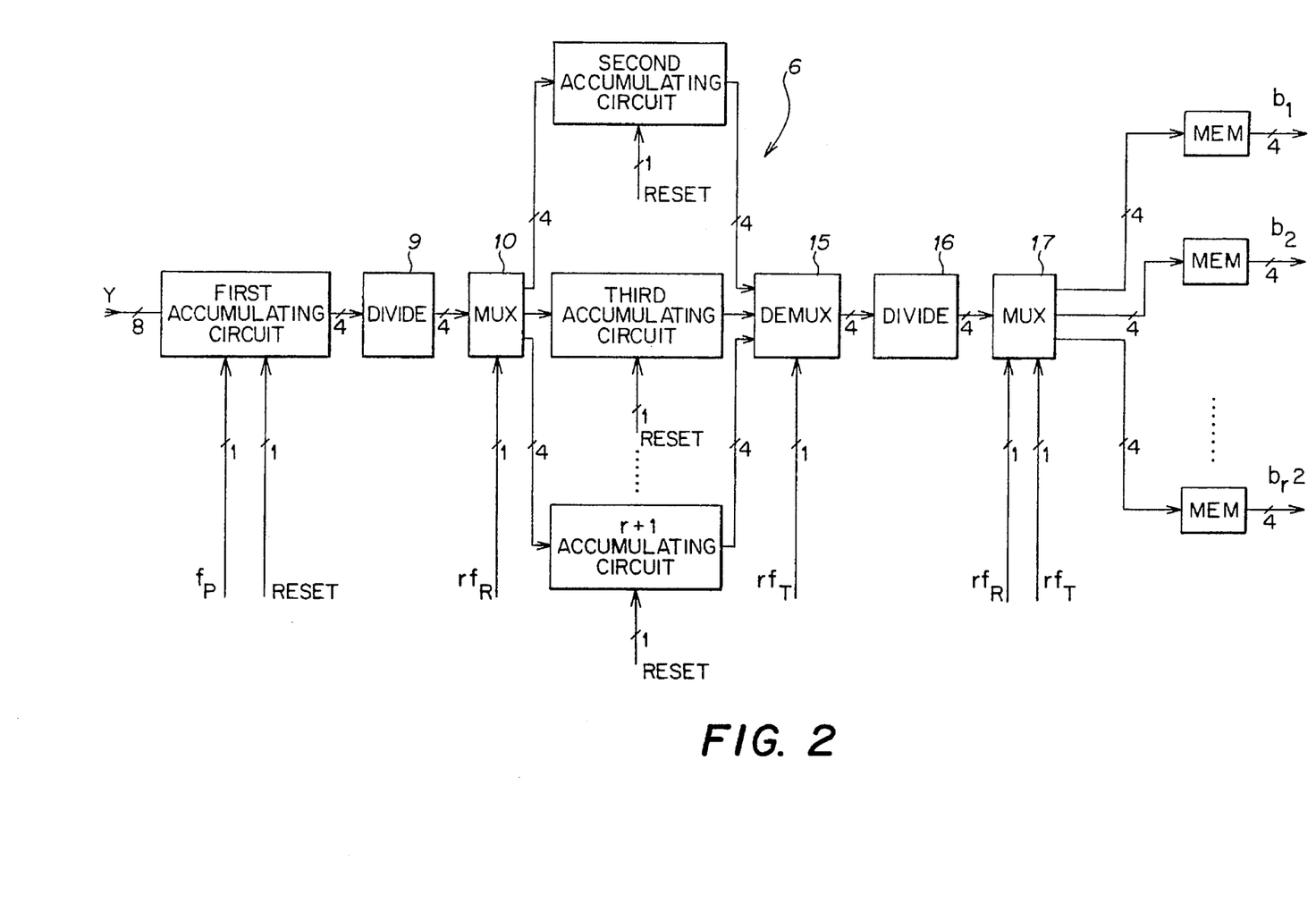
FIG. 2 is a diagrammatic detail view of the general form of the Brilliance Estimating Block of the filter architecture shown in FIG. 1.

Connected to the timing block 3 is an image portion brilliance estimating block 6, shown in detail in FIG. 2, which has first, second, and third input terminals adapted to receive the signals fp, rfr, and rft, respectively, from the timing block 3 and a fourth input terminal adapted to receive the signal Y representing the luminance component associated with the image to be processed.

The image portion brilliance estimating block 6 splits the image to be processed into sections and determines the mean brilliance value of said sections using the formula, $$bi = 1/Num \ \& \ f(y,x),$$

where bi is the mean brilliance value for the i-th block, Num is the number of pixels contained within said i-th block, and f(y,x) is the image to be processed, expressed as a function of two variables y and x, representing the spatial co-ordinates of the pixels that make up the image.

In particular, the image portion brilliance estimating block 6 will resolve an image to be processed into $r^2$ blocks (where r=1, . . . , n), and calculate the mean value of grey for each of them.

To explain the operation of the brilliance estimating block 6 in greater detail, the particular case will be considered for r=2, that is, for an image that is split into four blocks.

Figure 3:
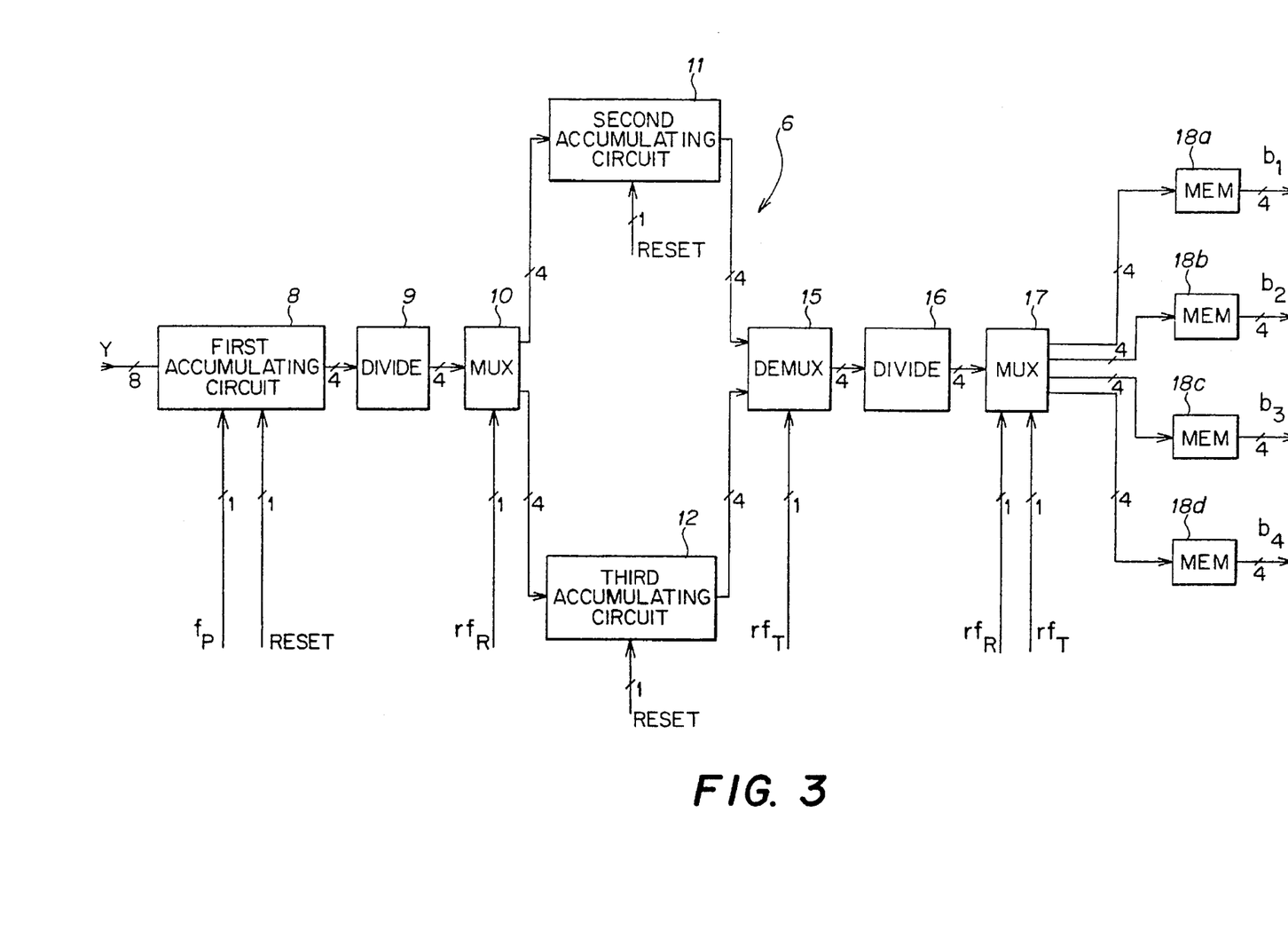
FIG. 3 is a diagrammatic view of FIG. 2 showing a Brilliance Estimating Block specifically configured for an image divided into four sections.

With reference to FIG. 3, the brilliance estimating block 6 comprises a first accumulating block 8 which adds together the grey values present in the first half of the first of the image lines. Said first accumulating block 8 has a first input terminal which receives the signal Y, representing the luminance component of the image to be processed, and a second input terminal which receives the signal fp from the timing block 3.

The summing block 8 is connected to a dividing block 9 that divides the sum value from the first accumulating block 8 by the number of the pixels present in the first half of the first of the image lines.

The result of this division is stored, through a first multiplexer 10 connected to the dividing block 9, in a second accumulating block 11. The multiplexer 10 has a first input terminal connected to the dividing block 9 and a second input terminal adapted to receive the signal rfr from the timing block 3.

The first accumulating block 8 also has a third input terminal which is supplied a reset pulse to enable the adder to clear the results from the first half of the first of the image lines and to perform a sum of the grey values present in the second half of the first of the image lines. Within the dividing block 9, the value of this sum is divided by the number of the pixels present in the second half of the first of the image lines.

The result of this division is stored in a third accumulating block 12 through the multiplexer 10.

Figure 4:
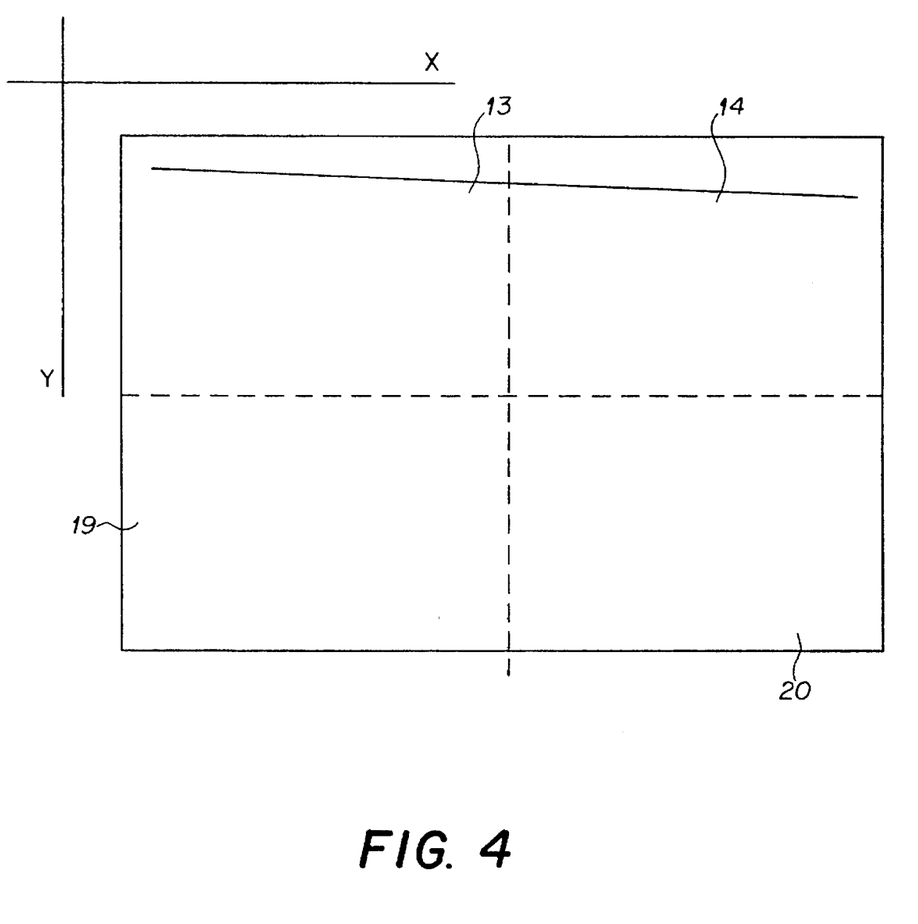
FIG. 4 shows a video image, for processing by the filter architecture of FIG. 1, split into four sections with a first video line brought out.

With reference now to FIG. 4, after processing the first of the image lines, the mean value of grey associated with the first half of the first image line is stored into the second accumulating block 11, while the mean value of grey associated with the second half of the first image line is stored into the third accumulating block 12.

Since, in the instance under consideration, the image to be processed has been split into four blocks, the mean value of grey stored in the second accumulating block 11 will be the mean value of grey associated with the first of the lines in a first section 13 of the image so split, and the mean value of grey stored into the third accumulating block 12 will be the mean value of grey associated with the first of the lines in a second section 14 of the split image.

The above-described operations are then repeated for each of the lines in the sections 13 and 14. The sections 13 and 14 correspond to the first half of the image to be processed.

Considering now the section 13, at the end of the last line in said section (which corresponds to the first half of the line located at the image middle), the value of the sum of the mean grey values for the lines of the section 13 is stored in the second accumulating block 11. This value is then supplied to a dividing block 16 through a demultiplexer 15 connected to the second accumulating block 11.

The demultiplexer 15 has a first input terminal connected to the second accumulating block 11, a second input terminal connected to the third accumulating block 12, and a third input terminal to receive the signal rft from the timing block 3.

The dividing block 16 performs the division of the sum value from the second accumulating block 11 by the number of the lines present in the section 13 to yield a mean value of grey of the section 13 as a result.

This result is stored, through a second multiplexer 17 connected to the dividing block 16, into a first memory block 18a. Considering the section 14, at the end of the last of the lines in said section (which corresponds to the second half of the lines located at the middle of the image), the sum of the mean values of grey for the section 14 lines is stored in the third accumulating block 12.

The value of that sum is then supplied to the dividing block 16 through the demultiplexer 15. The dividing block 16 divides the value of the sum from the third accumulating block 12 by the number of the lines present in the section 14 to yield a mean value of grey for the section 14 as a result.

This result is stored in a second memory block 18b through the multiplexer 17. The accumulating blocks 11 and 12 have each an input terminal which is supplied a reset pulse to clear its contents. In this way, such adders are used to calculate the mean values of grey associated with a third 19 and a fourth 20 of the sections into which the image to be processed has been split.

To calculate said mean values, the same operations as previously described in connection with the calculation of the mean grey values for the sections 13 and 14 are repeated.

In general, the number of the accumulating blocks and the number of the memory blocks included in the image brilliance estimating block 6 will be dependent on the value of r. FIG. 2 illustrates the general form of a brilliance estimating block for a value of r greater than two.

Figure 5:
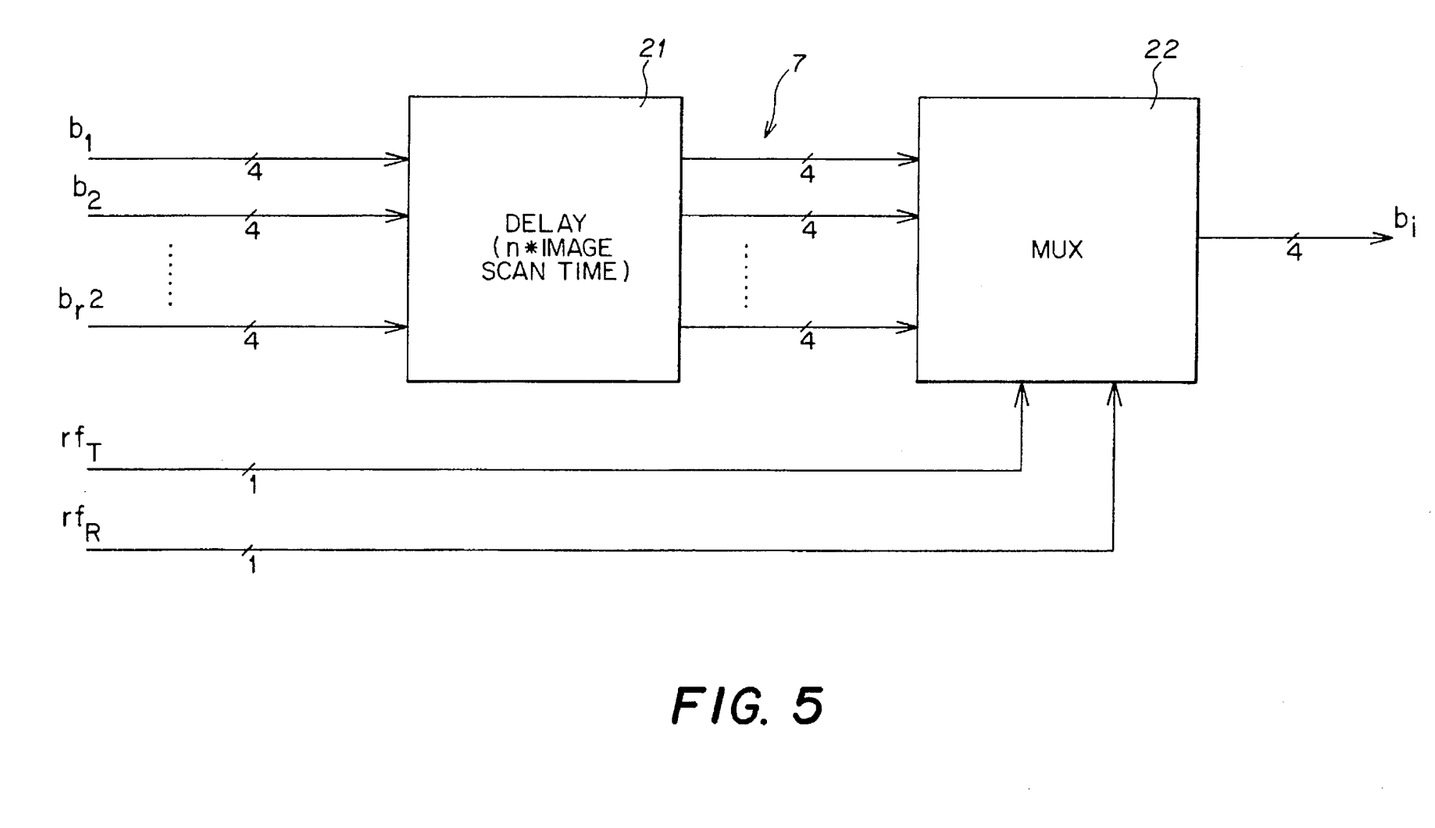
FIG. 5 is a diagrammatic detail view showing the synchronization block of the filter architecture of FIG. 1.

The filter architecture 1 of FIG. 1 includes a synchronization block 7, as shown in FIG. 5, which comprises a delay block 21 having at least $r^2$ input terminals connected to the image brilliance estimating block 6 and a multiplexer 22, having at least $r^2$ input terminals connected to the delay block 21 and at least two input terminals adapted to receive the signals rfr and rft from the timing block 3.

The delay block 21 is formed of a delay line providing a delay which is n times (with n=0.1) the scan time of the whole image to be processed.

The multiplexer 22 provides synchronization of the mean brilliance value of each of the sections into which the image to be processed has been split with the pixels being processed.

It should not be overlooked that if r=1, no synchronization block 7 would be provided in the filter architecture 1.

Figure 6:
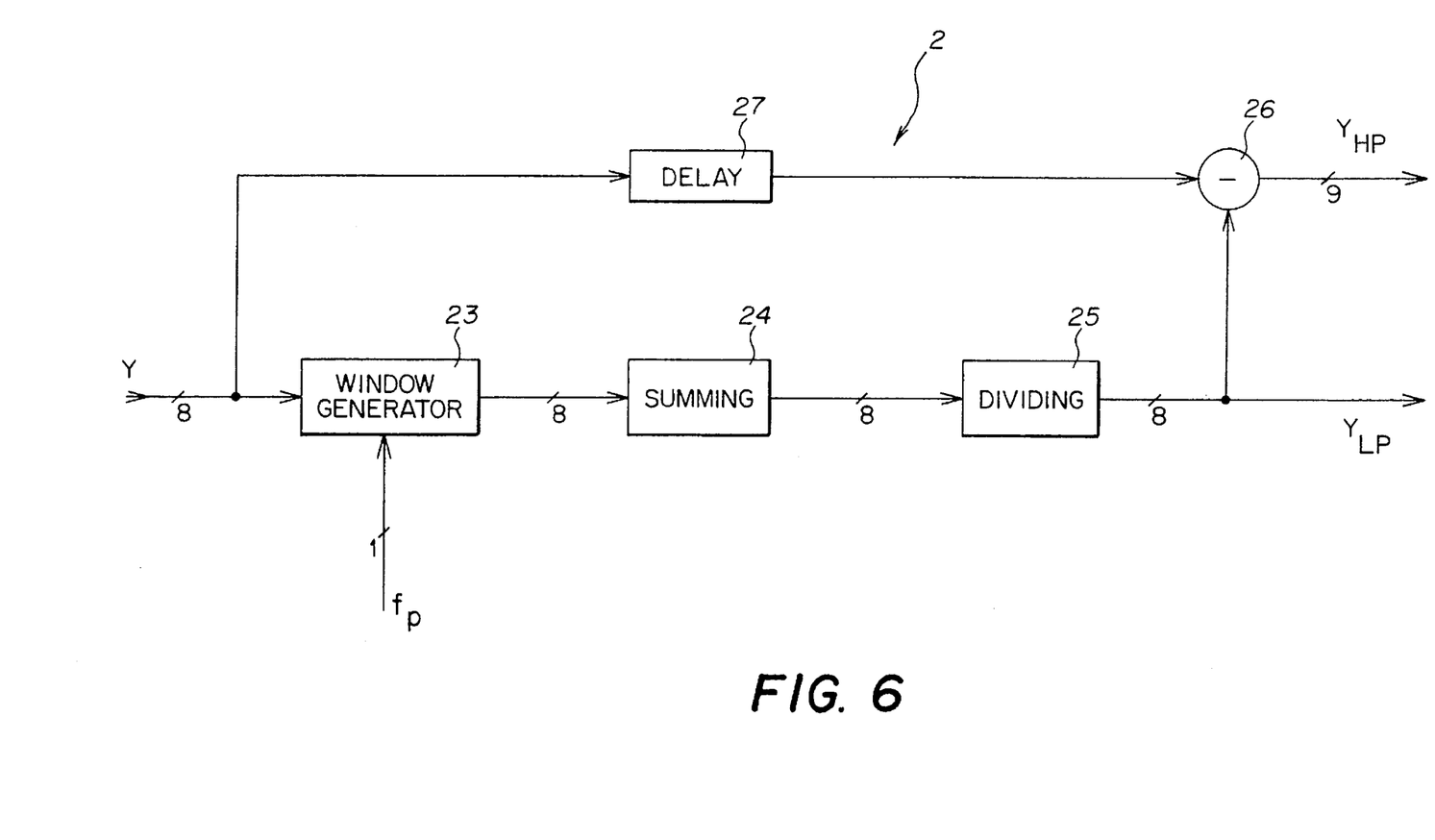
FIG. 6 is a diagrammatic detail view showing the filter block included in the filter architecture of FIG. 1.

The filter architecture 1 includes a filtering block 2, as shown in FIG. 6, which serves the function of calculating the high-pass Yhp and low-pass Ylp spatial frequency components of the image to be processed.

The filter block calculates, the low-pass component Ylp by determining the mean value of grey of the pixels present in an image window centered on a pixel to be processed. To carry out this calculation, the filtering block 2 is provided with a windowing block 23, which has a first input terminal adapted to receive the signal Y representing the luminance component of the image to be processed and a second input terminal adapted to receive the signal fp from the timing block 3, a summing block 24 having an input terminal connected to the windowing block 23, and a dividing block 25 having an input terminal connected to the summing block 24.

The dividing block 25 outputs the low-pass component Ylp of the image to be processed.

The windowing block 23 identifies an image window centered on a pixel to be processed, whose size is H*W, where H is the number of line memories which make up the window, and W is the number of the columns therein.

The image windowing block comprises, moreover, an address circuit which, given the coordinates m and n that identify the location of the pixel on which the window is centered, supplies to the summing block 24 the values m±I and n±j, where i≦H/2, and j≦W/2 pixels. These values specify the coordinates of the pixels contained within the window under consideration.

The summing block 24 carries out a sum of the grey values for the pixels present within the window under consideration.

The value of this sum is then supplied to the dividing block 25, which divides said value by the number of pixels present in the window considered to yield a mean value of grey for said pixels.

This mean value identifies the low-pass component Ylp of the image to be processed.

The high-pass component Yhp of that image, which identifies the image contrast, is obtained by calculating the difference between said image and its low-pass component Ylp using a subtractor 26 provided in the filtering block 2.

The filtering block 2 further comprises a delay block 27 having an input terminal adapted to receive the signal Y representing the luminance component of the image to be processed, and an output terminal connected to the subtractor node 26.

The delay block 27 has been introduced to take account of the delays in calculating the low-pass component Ylp, through the blocks 23, 24, and 25.

Figure 7:
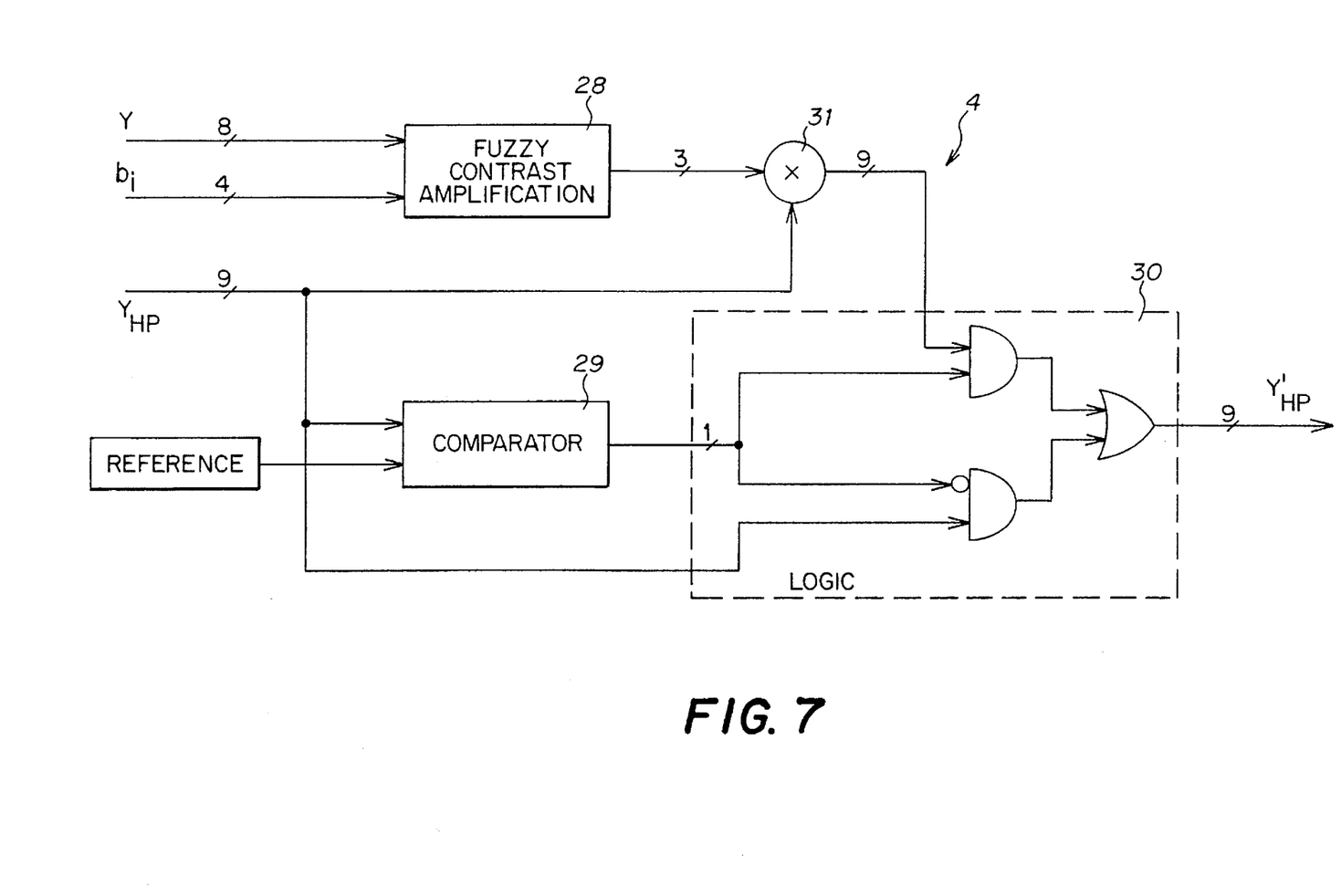
FIG. 7 is a diagrammatic detail view illustrating the first image characteristic adjusting block of the filter architecture of FIG. 1.
Figure 9:
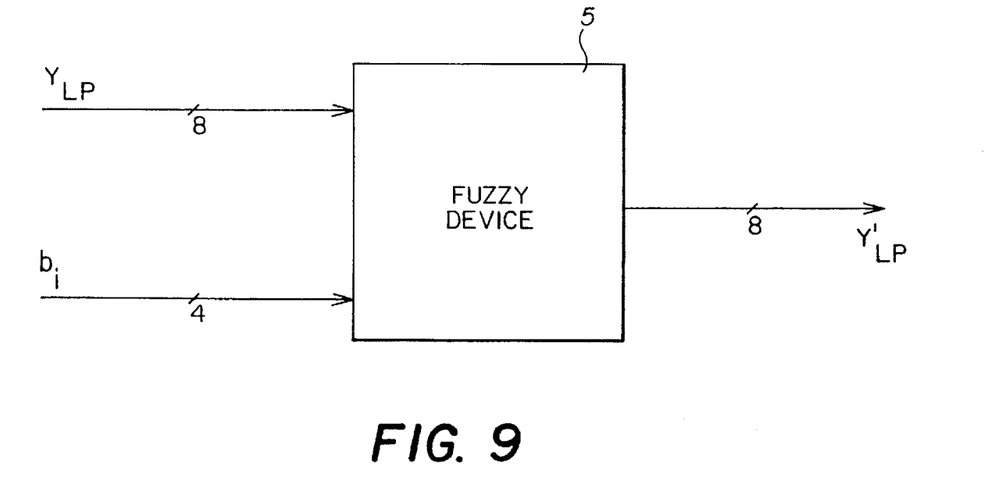
FIG. 9 is a diagrammatic detail view illustrating the second image characteristic adjusting block of the filter architecture of FIG. 1.

Also provided in the filter architecture 1 are first and second image characteristic adjusting blocks 4 and 5 as shown in FIGS. 7 and 9, respectively. Such blocks operate on a type of logic known as Fuzzy Logic in the pertinent literature.

By using Fuzzy logic, so-called inference operations are performed in said image characteristic adjusting blocks 4 and 5 which are basically configured as rules of the IF-THEN type with at least one fore-preposition and at least one after-implication.

More particularly, within the first image characteristic adjusting block 4 shown in FIG. 7, inference operations are carried out which determine a factor k of image contrast amplification from brilliance levels of image sections and grey levels of pixels.

The first image characteristic adjusting block 4 comprises a contrast amplification block 28 having a first input terminal adapted to receive the signal Y representing the luminance component of the image to be processed and a second input terminal connected to the synchronization block 7, a comparator block 29 having an input terminal connected to the filtering block 2, and a logic block 30 having a first input terminal coupled to the contrast amplification block 28 via a multiplier node 31, a second input terminal connected to the comparator block 29, and a third input terminal connected to the filtering block 2.

Furthermore, the first image characteristic adjusting block 4 is provided with an additional input terminal connected to the filtering block 2.

Figure 8:
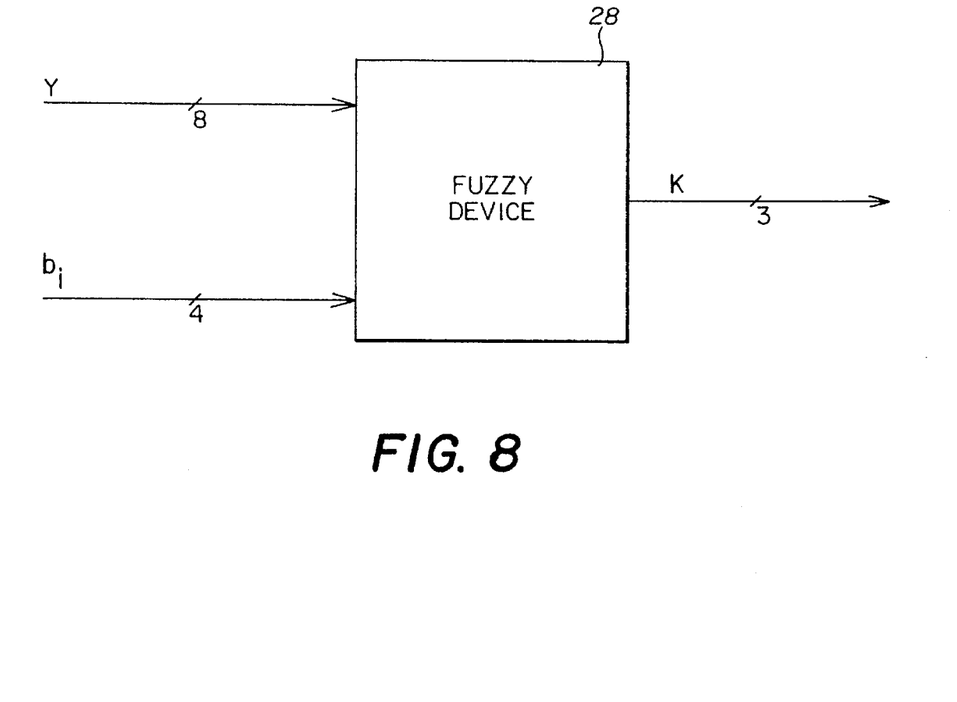

The contrast amplification block 28 is implemented as a device able to perform a fuzzy computation, as shown in FIG. 8.

The comparator block 29 and the logic block 30 prevent small amplitude noise admitted to the filter architecture 1 from becoming amplified along with the image contrast.

Thus, when the modulo of the high-pass component Yhp of the image to be processed (which modulo identifies an image contrast value) is lower than a threshold value determined by the comparator block 29, the high-pass component will be passed unaltered, while, by contrast, it will be amplified when its modulo is above said threshold value.

The logic block 30 is implemented as a combinatorial circuit which functions as a switch to pass either the amplified high-pass component Y'hp being output by the block 28 or the unaltered high-pass component Yhp from the filtering block 2.

The second image characteristic adjusting block 5, shown in FIG. 9, performs by inference operations a reduction in the image brilliance variation. The block 5 receives as input the mean brilliance levels of image sections to which a pixel to be processed belongs and the low-pass component Ylp of the black/white image to be processed from the filtering block 2. The second image characteristic adjusting block 5 is implemented as a device able to perform a fuzzy computation.

The image characteristic adjusting blocks 4 and 5 each have an output terminal that couples to a summer 36. The summer re-constructs, from the suitably modified high-pass and low-pass components, the signal Y' representing the luminance component as suitably modified which appears at the output of the filter architecture 1.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A digital signal filter for video images, comprising:

a timing circuit having first, second, and third outputs for providing synchronism command signals;

a filter circuit having a first input coupled to an input of the digital signal filter, and a second input coupled to the first output of the timing circuit, said filter circuit including means for separating from an input signal high frequency components and low frequency components and for generating first and second outputs for the high and low frequency components, respectively;

a brilliance estimation circuit having a first input coupled to said input of the digital signal filter, and at least second, third, and fourth inputs respectively coupled to the first, second, and third outputs of the timing circuit, said brilliance estimation circuit having means for measuring and memorizing brilliance values associated with at least one image section:

a first image characteristic adjusting circuit for a first image characteristic, operated using fuzzy logic, having a first input coupled to said input of the digital signal filter, a second input coupled to said first output of the filter circuit, and a third input coupled to at least one output of said brilliance estimation circuit; and a second image characteristic adjusting circuit for at least a second image characteristic, operated in a manner based on Fuzzy logic, having a first input coupled to said second output of the filter circuit and a second input coupled to said at least one output of the brilliance estimation circuit.

2. The digital signal filter according to claim 1, further comprising a synchronization circuit coupled between the third input of the first image characteristic adjusting circuit and said at least one output of the brilliance estimation circuit, and between the second input of the second image characteristic adjusting circuit and said at least one output of the brilliance estimation circuit.

3. The digital signal filter according to claim 2, wherein an image is split into a number of sections by said brilliance estimation circuit, and said brilliance estimation circuit has a plurality of outputs equal in number to said number of sections, said outputs being coupled to inputs of said synchronization circuit.

4. The digital signal filter according to claim 1, wherein the first image characteristic adjusting circuit comprises:

at least one contrast amplification circuit including a device able to perform a fuzzy computation and having a first input coupled to said input of the digital signal filter and a second input coupled to said at least one output of the brilliance estimation circuit;

at least one comparator having an input coupled to said first output of the filter circuit;

at least one logic circuit having a first input coupled to an output of said at least one contrast amplification circuit, a second input coupled to an output of said at least one comparator, and a third input coupled to said first output of the filter circuit.

5. The digital signal filter according to claim 1, wherein the second image characteristic adjusting circuit comprises a device able to perform a fuzzy computation.

6. The digital signal filter of claim 1, accepting as input a sequence of signals representing luminance of a video image that is divisible into a plurality of sections, wherein the brilliance estimation circuit comprises:

at least one summing circuit;

at least one dividing circuit coupled to the at least one summing circuit; and a plurality of memory circuits coupled to the at least one dividing circuit;

wherein the at least one summing circuit and the at least one dividing circuit are constructed and arranged to generate mean values of luminance for each of the plurality of sections of the video image and to store said mean values in said plurality of memory circuits.

7. A video filter for adjusting an input signal for a video image, comprising:

a brilliance estimation circuit that generates, in response to the input signal, a mean brilliance signal for each of a plurality of sections of the video image;

a filter circuit that separates the input signal into a high-pass filtered component and a low-pass filtered component;

a first image characteristic adjusting circuit that applies Fuzzy Logic operations to generate, in response to the mean brilliance signal and the high-pass filtered component, a modified high-pass filtered component;

a second image characteristic adjusting circuit that applies Fuzzy Logic operations to generate, in response to the mean brilliance signal and the low-pass filtered component, a modified low-pass filtered component; and a summing circuit that combines the modified high-pass and low-pass filtered components to generate an adjusted video signal.

8. The video filter of claim 7, wherein the first image characteristic adjusting circuit comprises:

a contrast amplifier that generates a contrast gain term in response to the input signal and the mean brilliance signal, and that multiplies the contrast gain term by the high-pass filtered component to generate an amplified high-pass signal;

a comparator that determines which of the high-pass filtered component and a noise threshold signal is greater;

a logic circuit that generates, in response to the determination of the comparator, the modified high-pass filtered component by selecting one of:

the high-pass filtered component, when the high-pass filtered component is smaller than the threshold signal; and the amplified high-pass filtered component, when the high-pass filtered component is larger than the threshold signal.

9. The video filter of claim 8, wherein the contrast amplifier comprises a device able to perform a fuzzy computation that associates, using Fuzzy Logic operations, the input signal and the mean brilliance signal to the contrast gain term.

10. The video filter of claim 9, wherein Fuzzy Logic operations include operations substantially configured as IF-THEN rules with at least one fore-preposition and at least one after-implication.

11. The video filter of claim 7, wherein the second image characteristic adjusting circuit comprises a device able to perform a fuzzy computation that associates, using Fuzzy Logic operations, the low-pass filtered component and the mean brilliance signal to a reduction signal.

12. The video filter of claim 11, wherein Fuzzy Logic operations include operations substantially configured as IF-THEN rules with at least one fore-preposition and at least one after-implication.

13. The video filter of claim 7, wherein the filter circuit comprises averaging circuits that generate the low-pass filtered component for an individual pixel of the video image as an average of a window of pixels surrounding the individual pixel.

14. The video filter of claim 13, wherein the filter circuit generates the high-pass filtered component as a difference between the input signal and the low-pass filtered component.

15. The video filter of claim 7, further comprising a timing circuit that generates:

a frequency reference signal synchronized to a line scan rate of the input signal; and first and second multiplied frequency signals whose frequency is a multiple "r" of the frequency of the frequency reference signal.

16. The video filter of claim 7, wherein the brilliance estimation circuit comprises:

a first accumulating circuit that generates first sum signals by successively adding pixel values for a scan of the input signal for each of the sections of the video image;

a first dividing circuit that divides the first sum signals by a number of pixels added together in the first accumulating circuit to generate first average signals;

a plurality of additional accumulating circuits that receive and add together the first average signals to generate sums of the first average signals; and a second dividing circuit that divides the sums of the first average signals by a number of scans per section to generate the mean brilliance signal for each of the plurality of sections of the video image.

17. The video filter of claim 16, further comprising:

a timing circuit that generates a frequency reference signal synchronized to a line scan rate of the input signal;

first and second multiplied frequency signals whose frequency is a multiple "r" of the frequency of the frequency reference signal; and "r" said additional accumulating circuits.

18. The video filter of claim 16, further comprising a memory circuit that stores the mean brilliance signal of at least one of the plurality of sections of the video image.

19. The video filter of claim 18, wherein there is one memory circuit for each of the plurality of sections of the video image.

20. A video filter, comprising:

means for generating, from an input signal encoding pixels of a video image, a signal indicative of a mean brightness for each of a plurality of sections into which the video image is divided;

means for generating a low-pass filtered signal indicative of slow changes in brightness of the video image;

means for generating a high-pass filtered signal indicative of rapid changes in brightness of the video image;

means, responsive to the signal indicative of mean brightness, for applying Fuzzy Logic operations to adjust the high-pass filtered signal to generate a modified high-pass filtered signal;

means, responsive to the signal indicative of mean brightness, for applying Fuzzy Logic operations to adjust the low-pass filtered signal and generate a modified low-pass filtered signal; and means for combining the modified high-pass and modified low-pass signals to generate a modified video signal.

21. The video filter of claim 20, wherein the means for combining is an adding circuit.

22. The video filter of claim 20, wherein the means for generating the low-pass filtered signal comprises means for determining an average of pixels within a window of a predetermined size.

23. The video filter of claim 22, wherein the means for generating the high-pass filtered signal comprises means for subtracting the low-pass filtered signal from the input signal.

24. The video filter of claim 20, wherein the means for adjusting the high-pass filtered signal comprises:

means, responsive to the input signal and to the signals indicative of mean brightness, for generating an adjusted high-pass signal;

means for determining whether the high-pass filtered signal exceeds a threshold signal; and means for selecting the high-pass filtered signal for output as the modified high-pass filtered signal when the high-pass filtered signal is smaller than the threshold signal, and for selecting the adjusted high-pass signal for output as the modified high-pass filtered signal when the high-pass filtered signal is larger than the threshold signal.

25. The video filter of claim 24, wherein the means for generating the adjusted high-pass signal applies Fuzzy Logic operations.

26. The video filter of claim 25, wherein Fuzzy Logic operations include operations substantially configured as IF-THEN rules with at least one fore-preposition and at least one after-implication.

27. The video filter of claim 25, wherein Fuzzy Logic operations includes accessing a device able to perform a fuzzy computation.

28. The video filter of claim 20, wherein the means for applying Fuzzy Logic operations to adjust the low-pass filtered signal applies Fuzzy Logic operations that include operations substantially configured as IF-THEN rules with at least one fore-preposition and at least one after-implication.

29. The video filter of claim 28, wherein Fuzzy Logic operations include accessing a device able to perform a fuzzy computation.

30. The video filter of claim 29, further comprising means for synchronizing the video filter to determine a time at which each pixel of the video image is processed, and to allow the video filter to split the video image into sections.

31. The video filter of claim 20, wherein the means for generating the signal indicative of mean brightness comprises:

means for accumulating a plurality of electrical signals that indicate brightness of individual pixels of the video image;

means for determining an average brightness of pixels from the accumulated electrical signals; and means for storing the average brightness of pixels within each section of the video image.

32. The video filter of claim 31, wherein an input sequence of said plurality of electrical signals has a pixel rate, and wherein the video filter further comprises means for synchronizing the generation of the modified video signal so that it has a rate equal to the pixel rate.

33. A method of filtering a video signal for a video image, comprising the steps of:

(A) determining a mean brilliance signal for each of a plurality of sections of the video image;

(B) separating the video signal into a high-pass signal and a low-pass signal;

(C) adjusting the high-pass signal by performing Fuzzy Logic operations;

(D) adjusting the low-pass signal by performing Fuzzy Logic operations; and (E) combining the adjusted high-pass and low-pass signals to generate a modified video signal.

34. The method of claim 33, wherein the step (C) further comprises the step of applying Fuzzy Logic operations to associate the high-pass signal, the video signal, and the mean brilliance signal with an amplification term.

35. The method of claim 34, wherein the step of applying Fuzzy Logic operations comprises the step of performing inference operations substantially configured as IF-THEN rules with at least one fore-preposition and at least one after-implication.

36. The method of claim 35, wherein the step of applying Fuzzy Logic operations further comprises the step of accessing a device able to perform a fuzzy computation.

37. The method of claim 34, wherein the step (C) further comprises the step of multiplying the amplification term by the high-pass signal to generate a modified signal.

38. The method of claim 37, wherein the step (C) further comprises the step of selecting the modified signal as the adjusted high-pass signal output only if the high-pass signal is greater than a threshold signal, and otherwise selecting the high-pass signal as output.

39. The method of claim 37, wherein the step (D) further comprises the step of applying Fuzzy Logic operations to associate the low-pass signal and the mean brilliance signal with a reduction term.

40. The method of claim 39, wherein step of applying Fuzzy Logic operations comprises the step of performing inference operations substantially configured as IF-THEN rules with at least one fore-preposition and at least one after-implication.

41. The method of claim 40, wherein the step of applying Fuzzy Logic operations further comprises the step of accessing a device able to perform a fuzzy computation.

* * * * *